United States Patent
Takahashi et al.

[11] Patent Number: 5,936,327
[45] Date of Patent: Aug. 10, 1999

[54] ELECTRO-MECHANICAL ENERGY CONVERSION DEVICE FOR VIBRATION DRIVEN ACTUATOR AND ITS MANUFACTURING METHOD

[75] Inventors: Shigeru Takahashi, Shiki; Sadakatsu Okura; Toshikatsu Nomura, both of Tokyo, all of Japan

[73] Assignees: Canon Kabushiki Kaisha; Taiheiyo Cement Corporation, both of Tokyo, Japan

[21] Appl. No.: 08/921,464

[22] Filed: Sep. 2, 1997

Related U.S. Application Data

[63] Continuation of application No. 08/463,632, Jun. 6, 1995, abandoned, which is a continuation of application No. 08/155,162, Nov. 19, 1993, abandoned.

[30] Foreign Application Priority Data

Nov. 20, 1992 [JP] Japan .................................. 4-335586

[51] Int. Cl.$^6$ .................................................. H01L 41/08
[52] U.S. Cl. .......................... 310/323; 310/366; 310/358
[58] Field of Search .................................... 310/323, 328, 310/366, 358

[56] References Cited

U.S. PATENT DOCUMENTS

| | | | |
|---|---|---|---|
| 2,761,076 | 8/1956 | Hansell | 310/334 X |
| 3,390,287 | 6/1968 | Sonderegger | 310/366 X |
| 4,580,073 | 4/1986 | Okumura et al. | 310/323 |
| 4,742,264 | 5/1988 | Ogawa | 310/366 X |
| 4,759,107 | 7/1988 | Ogawa et al. | 310/366 X |
| 5,036,240 | 7/1991 | Lew | 310/338 |
| 5,122,700 | 6/1992 | Tamai et al. | 310/323 |
| 5,124,611 | 6/1992 | Tamai et al. | 310/317 |
| 5,231,325 | 7/1993 | Tamai et al. | 310/323 |

FOREIGN PATENT DOCUMENTS 4-21371  1/1992  Japan .

*Primary Examiner*—Mark O. Budd
*Attorney, Agent, or Firm*—Fitzpatrick, Cella, Harper & Scinto

[57] ABSTRACT

In an electro-mechanical energy conversion device which is disclosed, green sheets on which whole surface electrodes for grounding have been printed and green sheets on which 2-divided electrodes have been printed are laminated. The green sheets having the 0° phase and 90° phase on which the 2-divided electrodes have been printed are laminated through the printed sheet on which the whole surface electrode for grounding. After the laminate body was sintered and integrated, it is polarized in a manner such that the polarizing directions in the thickness direction of each layer are opposite between the two divided electrodes which form one pair by using the whole surface electrodes for grounding and the 2-divided electrodes which were printed, thereby constructing the conversion device for the laminated type vibration driven motor.

9 Claims, 9 Drawing Sheets

ELECTRO-MECHANICAL ENERGY CONVERSION DEVICE FOR VIBRATION DRIVEN ACTUATOR AND ITS MANUFACTURING METHOD

This application is a continuation of application Ser. No. 08/463,632 filed Jun. 6, 1995 now abandoned, which is a continuation of application Ser. No. 08/155,162 filed Nov. 19, 1993, both now abandoned.

BACKGROUND OF THE INVENTION

1. Field of the Invention

The present invention relates to an electro-mechanical energy conversion device more particularly, it relates to an electro-mechanical energy conversion device for a laminated type vibration driven motor or a pencil shaped type vibration driven motor and a manufacturing method for such a device.

2. Related Background Art

Figure 8:
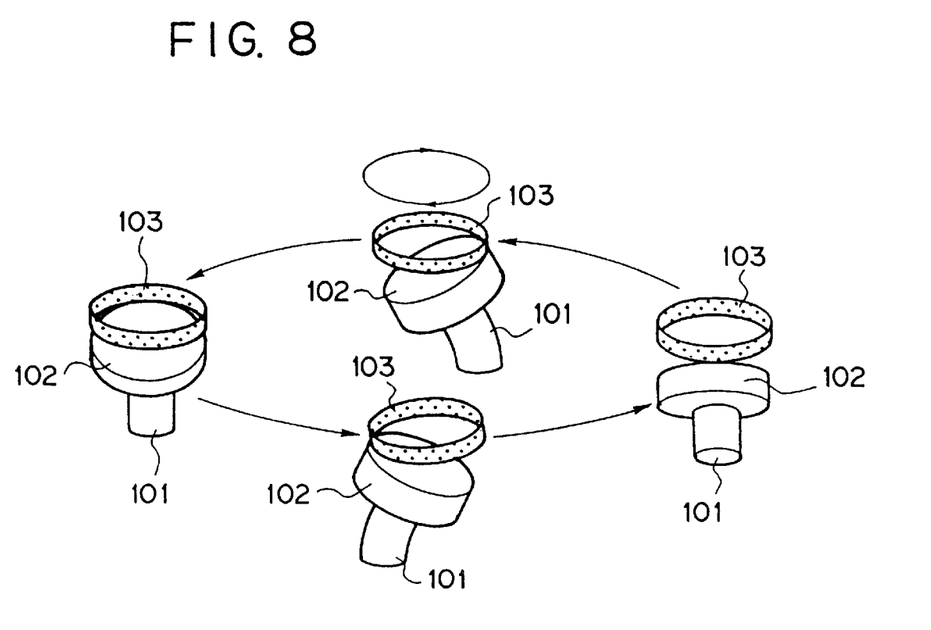
FIG. 8 is a conceptual diagram for explaining an operation principle of a laminated type vibration driven motor.

The laminated type vibration driven motor (hereinafter, simply referred to as a vibration driven motor or actuator) is constructed in a manner such that, as shown in FIG. 8, a disk-shaped stator 102 is attached to an edge of a shaft 101, a ring-shaped rotor 103 is pressure contacted to the upper surface of the stator 102, and when the shaft 101 executes a neck shaking motion while bending, the rotor 103 rotates due to a friction with the stator 102 (see U.S. Pat. Nos. 5,124,611 and 5,231,325).

Figure 9:
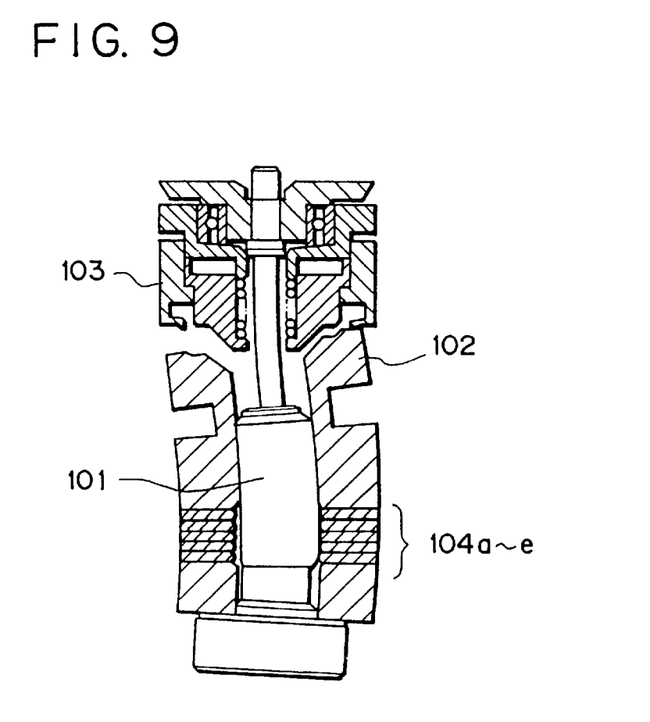
FIG. 9 is a cross sectional view showing a conventional laminated type vibration driven motor.
Figure 10:
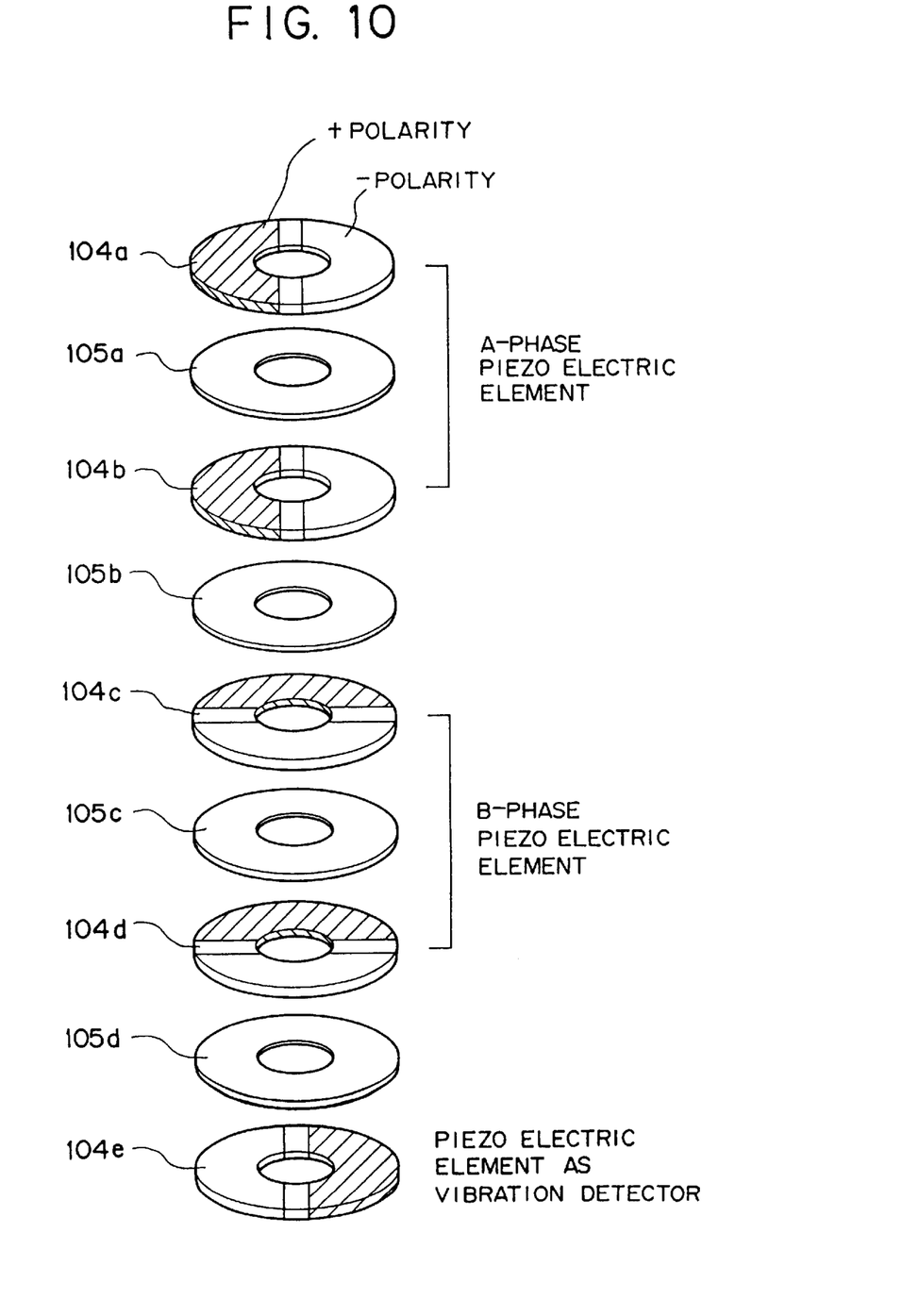
FIG. 10 is an exploded perspective view of a device for a conventional laminated type vibration driven motor.

FIGS. 9 and 10 show a specific structure of the conventional vibration driven motor. In the vibration driven motor, piezoelectric elements 104a to 104e which are stacked as five layers produce a neck shaking motion of the shaft 101. Each piezoelectric element 104 is divided into two portions and the polarizing directions in the thickness direction of the two divided portions of each piezoelectric element are opposite. When a voltage is applied, therefore, one of the two divided portions expands and the other contracts. When the direction of the voltage is changed, the expanded portion contracts and the contracted portion expands. In FIG. 10, the upper two piezoelectric elements 104a and 104b give a bending motion in the right/left direction to the shaft 101, the lower two piezoelectric elements 104c and 104d give a bending motion in the front/back direction to the shaft 101, and a neck shaking motion is executed by synchronizing those bending motions. The lowest piezoelectric element 104e is a piezoelectric element for detection of a resonance frequency in order to monitor a vibrating state of the motor.

According to the above vibration driven motor, as compared with the conventional ring-shaped vibration driven motor (see U.S. Pat. No. 4,580,073), the size and weight are ½ or less and the costs are ⅓ or less than those of the conventional motor. Therefore, a desired application of such device is to drive lenses of an automatic focusing single-lens reflex camera or the like in place of the ring-shaped vibration driven motor.

However, since the miniaturization of electronic parts progresses quickly, a further miniaturization of the laminated type vibration driven motor is demanded. In the above vibration driven motor, metal electrode plates 105a to 105d are used to apply AC voltages to produce the neck shaking motion. These electrode plates are respectively laminated to the laminated piezoelectric elements 104a to 104e so as to be inserted between the two piezoelectric elements. Therefore, a problem occurs in the realization of the miniaturization because of the thicknesses of the metal plates 105a to 105d and the complexity of electrode wirings.

When two kinds of AC voltages of different phases are applied to the piezoelectric elements, for example, in the case where it is necessary to apply a voltage of A volts to obtain a displacement of λ, it is known that the displacement of λ can be obtained by setting a thickness of each piezoelectric element to 1/n and by applying the voltage of A/n volts to each of the laminated piezoelectric elements of n layers. That is, in order to drive at a low voltage, it is known that it is preferable to make the thickness of each piezoelectric element thin and to use a structure in which a number of such thin piezoelectric elements are laminated.

According to a method of manufacturing the conventional laminated type vibration driven motor mentioned above, however, a binder or the like is added to the piezoelectric powder and a green sheet obtained by molding is sintered and, after that, the resulting sintered green sheet is individually polarized. Therefore, when the thickness of the piezoelectric element is made so thin, the handling in each processing step is difficult, the number of metal plates for the electrodes each of which is inserted between the piezoelectric elements increases, and the miniaturization cannot be realized. A problem also occurs in the realization of low voltage driving of the elements for the laminated type vibration driven motor. The costs also rise.

SUMMARY OF THE INVENTION

It is an object of the invention to provide an electro-mechanical energy conversion device for a laminated type vibration driven motor which can realize miniaturization and low voltage driving characteristics by radically changing a method of manufacturing an electro-mechanical energy conversion device for a vibration driven motor.

Another object of the invention is to provide a laminated type electro-mechanical energy conversion device of low costs.

The above and other objects and features of the present invention will become apparent from the following detailed description and the appended claims with reference to the accompanying drawings.

According to one aspect of the invention, green sheets on each of which a whole surface grounding electrode has been printed and green sheets on each of which a pair of divided electrodes has been printed are laminated in a manner such that the green sheets on which the divided electrodes have been printed are arranged having 0° phase and 90° phase for every other one of the even number sheets. The resultant laminate assembly is sintered so as to be integrated, and then is polarized using the printed whole surface grounding electrodes and the divided electrodes so that the polarizing directions in the thickness direction of the layers are opposite for each pair of divided electrodes. In this manner, a device for a laminated type vibration driven motor is manufactured.

DETAILED DESCRIPTION OF THE PREFERRED EMBODIMENTS

First, a binder is added into well-known piezoelectric powder and a green sheet having a thickness of about 100 μm is formed by an extrusion molding or a doctor blade method. The green sheet is punched. In this manner, five ring-shaped green sheets 1L, 2L, 3L, 4L, and 5L each having an outer diameter of 8 mm and an inner diameter of 3.3 mm are formed.

Figure 1:
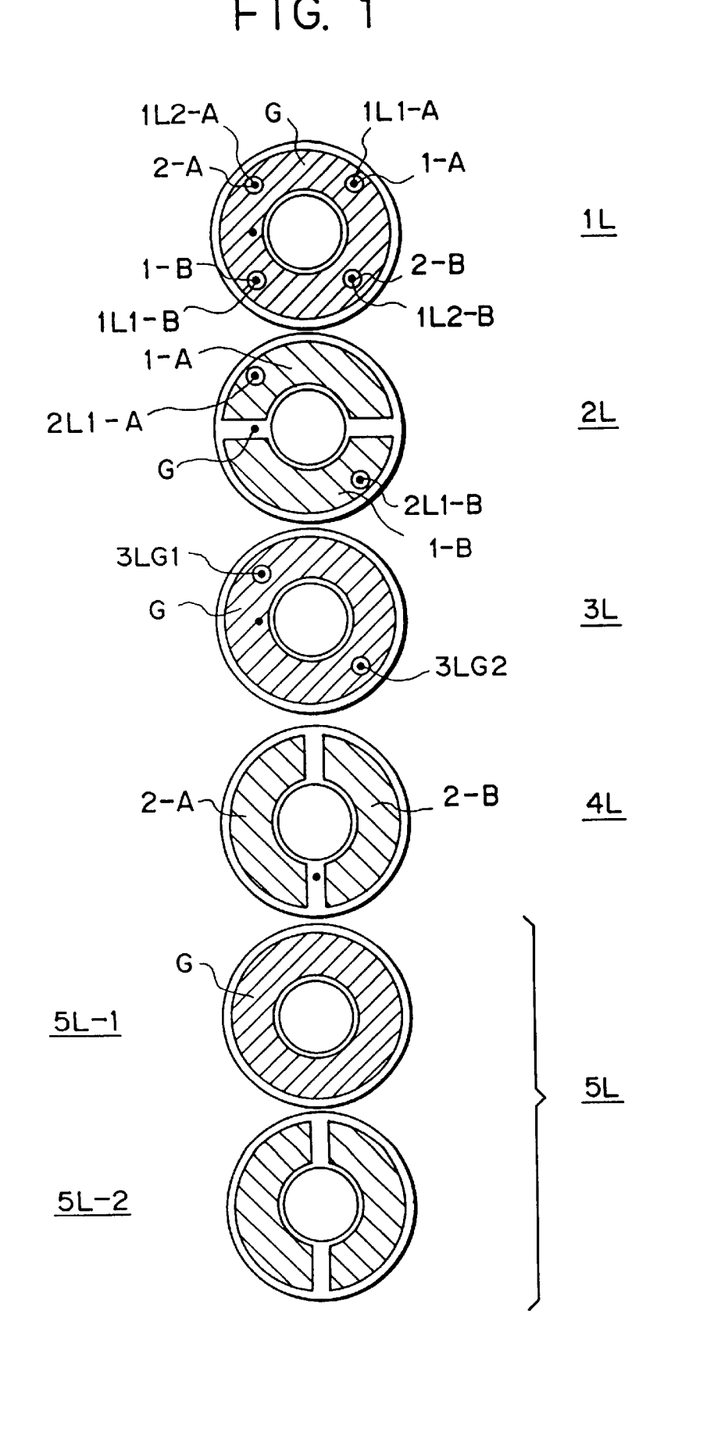
FIG. 1 is a plan view showing electrode patterns which are printed on green sheets.

As shown in FIG. 1, whole surface electrodes G for grounding and divided electrode pairs 1-A, 1-B and 2-A, 2-B are printed on the surfaces of the four punched green sheets 1L, 2L, 3L, and 4L, respectively. A conductive paste is used in the printing, such as a conductive paste of the Ag-Pd system or Pt system. A whole surface grounding electrode G is printed onto a front surface 5L-1 of green sheet 5L and a pair of divided electrodes is printed on a back surface 5L-2.

Figure 2:
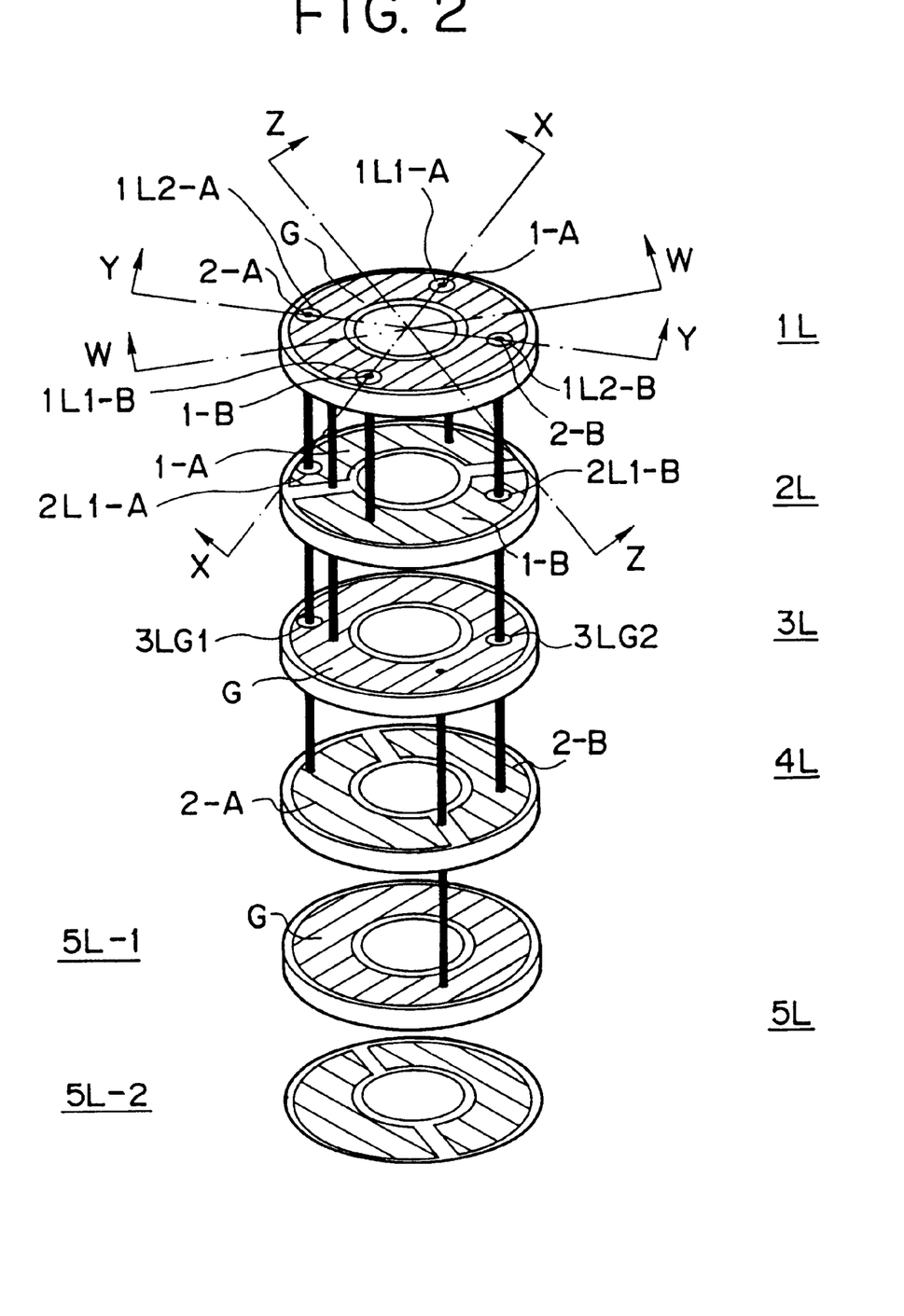
FIG. 2 is an exploded perspective view showing a laminating state of the green sheets.
Figure 3:
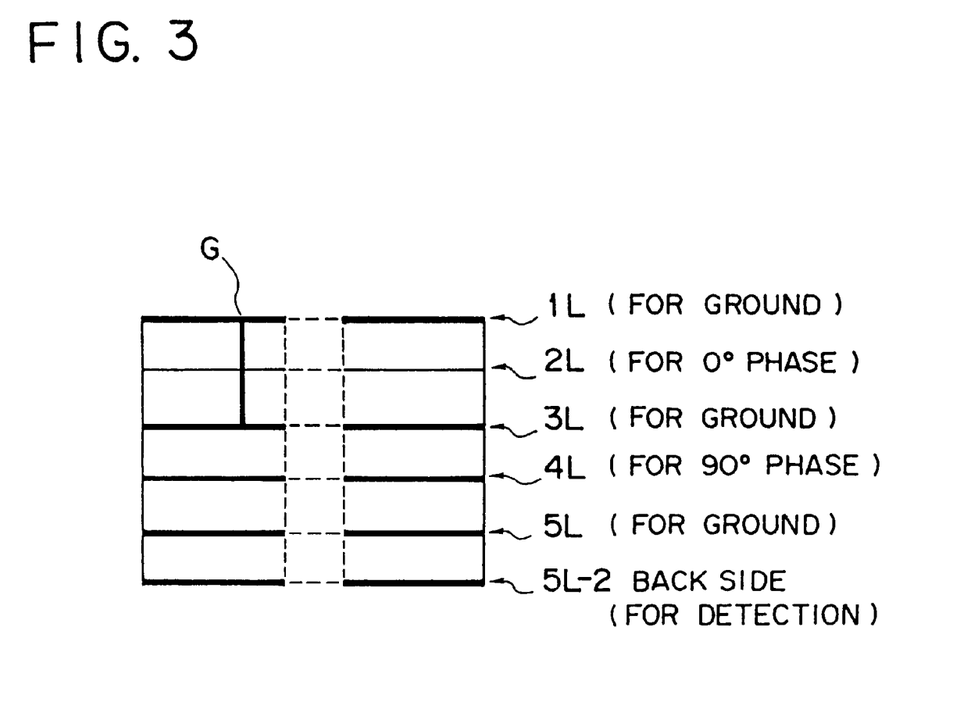
FIG. 3 is a cross sectional view taken along the line W—W in FIG. 2.
Figure 4:
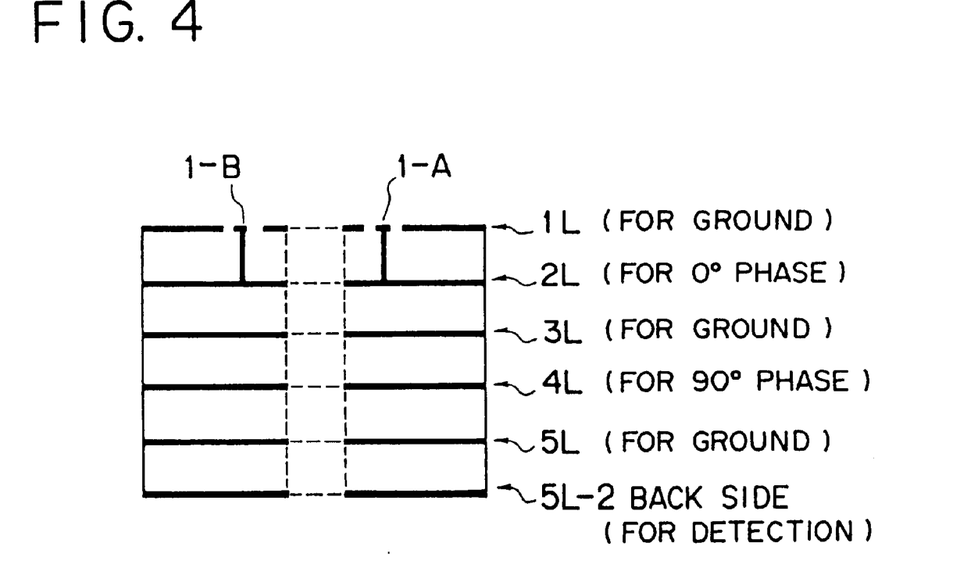
FIG. 4 is a cross sectional view taken along the line X—X in FIG. 2.
Figure 5:
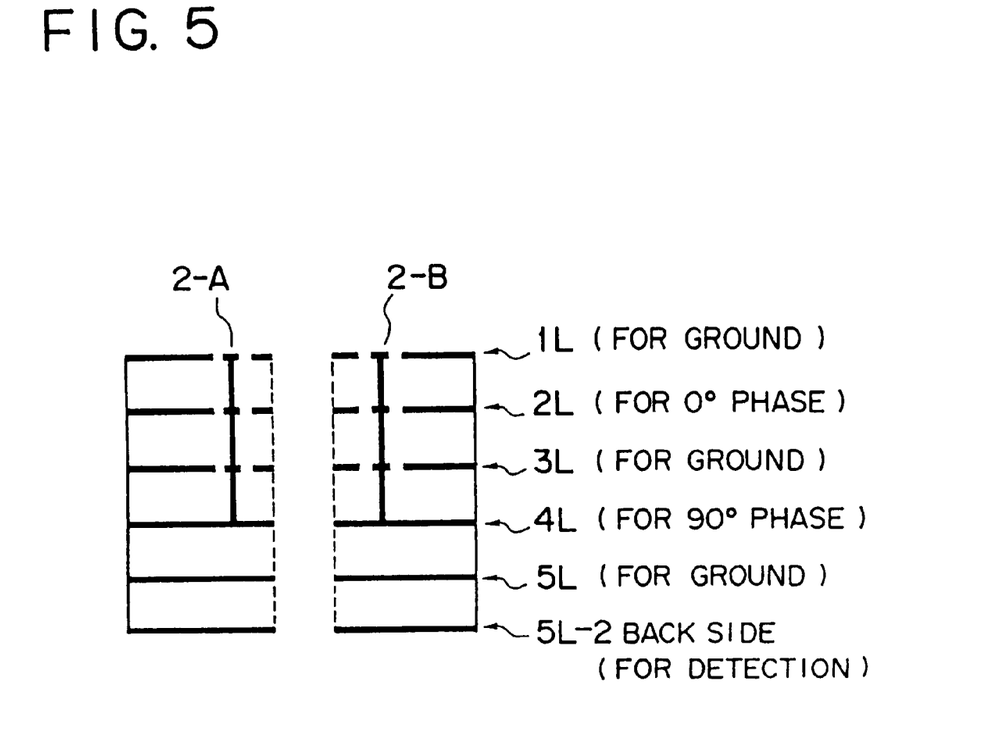
FIG. 5 is a cross sectional view taken along the line Y—Y in FIG. 2.
Figure 6:
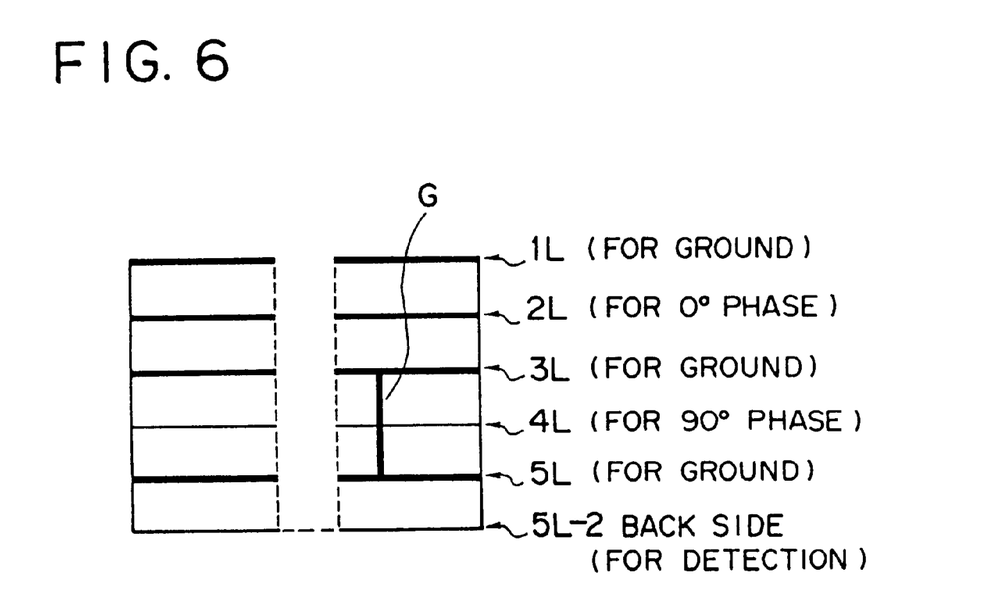
FIG. 6 is a cross sectional view taken along the line Z—Z in FIG. 2.

The above five green sheets 1L to 5L on which the electrodes were printed are laminated in a state as shown in FIG. 2. That is, the second layer 2L has the 0° phase of the divided electrodes. The fourth layer 4L has the 90° phase of the divided electrodes. The first, third, and fifth layers 1L, 3L, and 5L are ground layers (however, a pair of divided electrodes to detect a resonance frequency is printed on the back surface 5L-2 of the fifth layer 5L).

In FIG. 2, bold lines connecting the layers (1L to 5L) indicate that conduction is obtained. As shown in FIG. 1, conduction between the layers is performed by forming through holes 1L1-A, 1L1-B, 1L2-A, 1L2-B, 2L1-A, 2L1-B, 3LG1, and 3LG2 each having a diameter of 0.4 mm and by filling each through hole with the conductive paste at the stage of forming the green sheets. Electrode wirings using the through holes have structures shown in FIGS. 3 to 6 as cross sectional views taken along the lines W—W, X—X, Y—Y, and Z—Z in FIG. 2.

The above laminated green sheets are sintered and integrated. Sintering conditions of temperature and the like are set to conditions similar to those used in manufacturing of a conventional piezoelectric element.

The sintered body obtained is polarized so that opposite elements of each pair of divided electrodes have opposite polarities. For example, the electrodes 1-A and 2-A are set to the + side and the electrodes 1-B and 2-B are set to the − side and the polarizing directions in the thickness direction of each layer are set to one pair, thereby manufacturing an electro-mechanical energy conversion device for a laminated type vibration driven motor.

Figure 7:
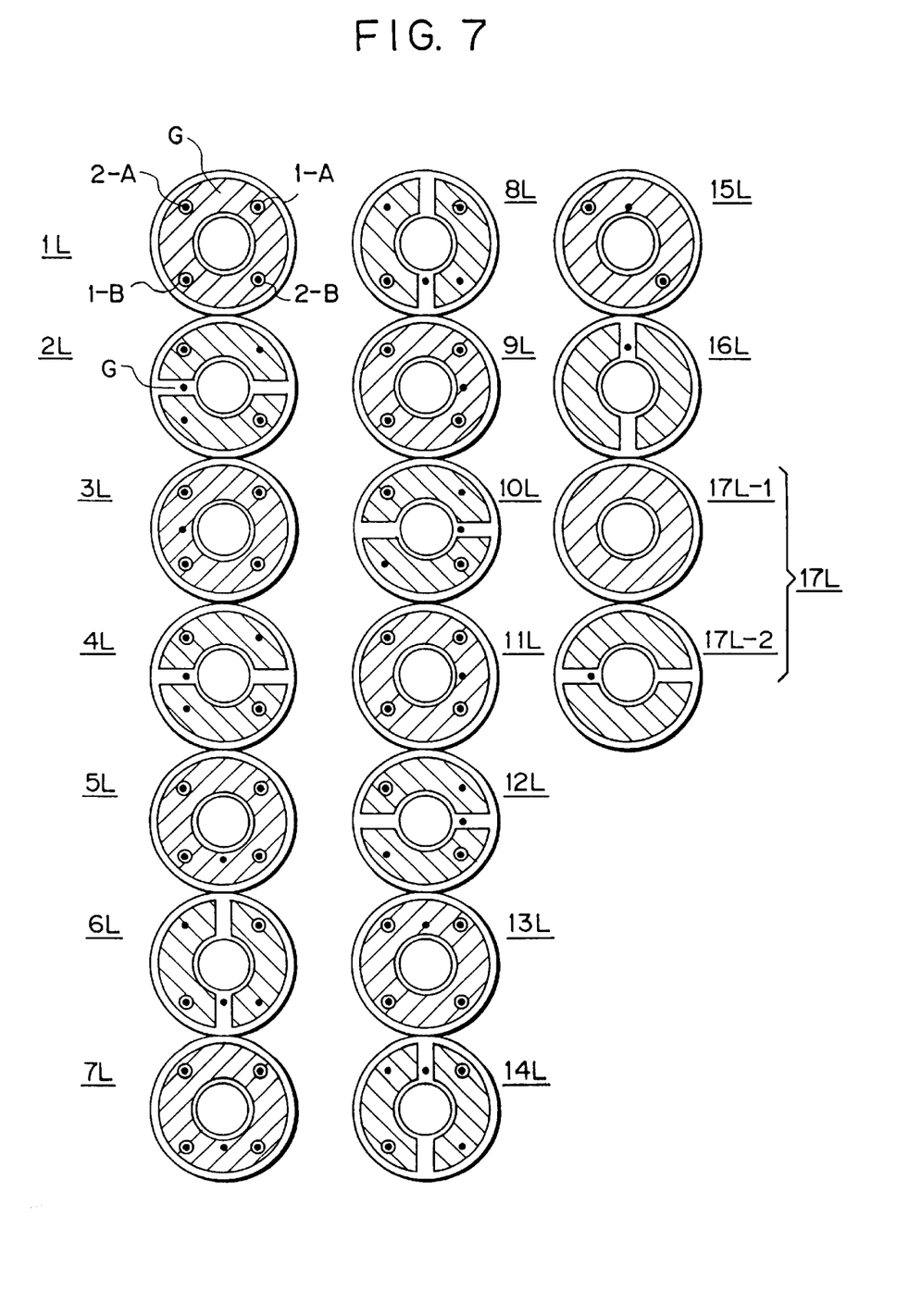
FIG. 7 is a plan view showing another embodiment of electrode patterns which are printed onto green sheets.

FIG. 7 shows electrode patterns of another embodiment of the present invention, including a 17 layer laminated type conversion device (layers 1L to 17L), in which driving at an even lower voltage is accomplished. The fundamental structure is similar to that of FIG. 1. Additional divided electrode pair layers of the 0° phase and 90° phase each having a thin thickness and ground electrode layers are provided and are integrated, thereby realizing the driving at a lower voltage.

Figure 11:
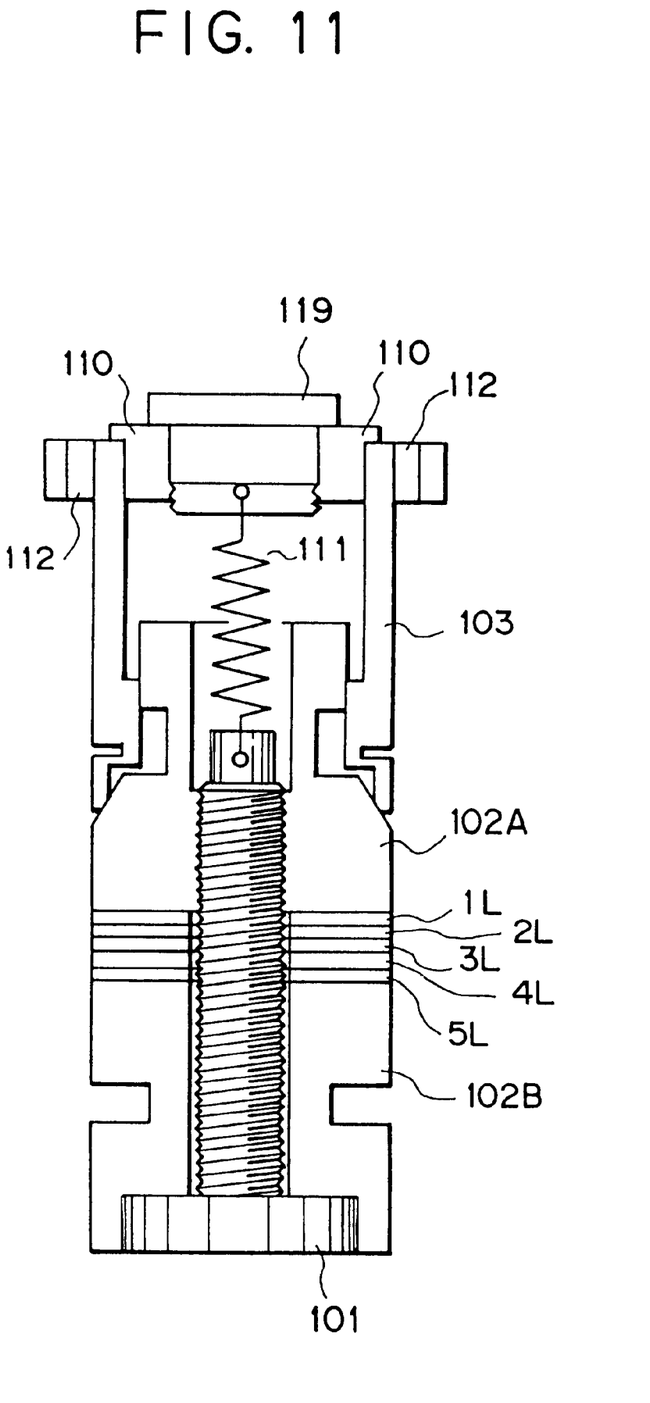
FIG. 11 is a constructional diagram of a main section of a vibration driven motor using an electro-mechanical energy conversion device according to the invention shown in FIG. 1.

FIG. 11 shows a constructional diagram of a main section of a vibration driven motor (vibration driven actuator) using the electro-mechanical energy conversion device for the vibration driven motor shown in FIG. 1. In FIG. 11, reference numerals 1L to 5L denote piezoelectric elements having the same structure as that of the piezoelectric elements shown in FIG. 1. The whole surface grounding electrode G of the first layer 1L is connected to a ground of an AC power source (not shown) through a lead wire (not shown). A conductive paste portion of the through holes of the first layer 1L electrically connected to the electrodes 1-A and 1-B of the second layer is connected to the (+) side of the power source through a lead wire (not shown). A conductive paste portion of the through holes of the first layer 1L electrically connected to the electrodes 2-A and 2-B of the fourth layer is connected to the (+) side of another AC power source whose phase is electrically different from the phase of the above power source by 90° through a lead wire (not shown). An AC voltage of Va=sin$_\omega$t is supplied to the piezoelectric element of the second layer. An AC voltage of Vb=cos$^\omega$t is supplied to the piezoelectric element of the fourth layer. The piezoelectric element as a vibration detector of the fifth layer 5L is electrically insulated from a bolt 101 and upper/lower vibrators 102A and 102B, which will be explained hereinlater. Reference numeral 103 denotes the well-known rotor which is pressure contacted to the vibrators 102A and 102B as stators by a spring force of a spring 111; 112 denotes a gear which is coaxially joined with the rotor 103 and generates a rotational force to a load; 119 denotes a spring post; 110 denotes a bearing; and 101 denotes a bolt to sandwich the piezoelectric elements 1L to 5L between the metallic upper vibrator 102A and the metallic lower vibrator 102B.

In the motor according to the above construction, in response to AC signals having phase differences which are supplied to the piezoelectric elements 1L to 4L, the piezoelectric elements are bent in predetermined directions, so that the stators 102A and 102B and the bolt 101 vibrate in a manner similar to the stators of the motor shown in the conventional example, the rotor 103 rotates, and the rotational force is transferred from the gear 112 to the load.

It is possible to efficiently drive the motor by controlling a driving frequency of the AC power source in accordance with the vibrating state of the stators generated from the vibration detector piezoelectric element 5L.

Figure 12:
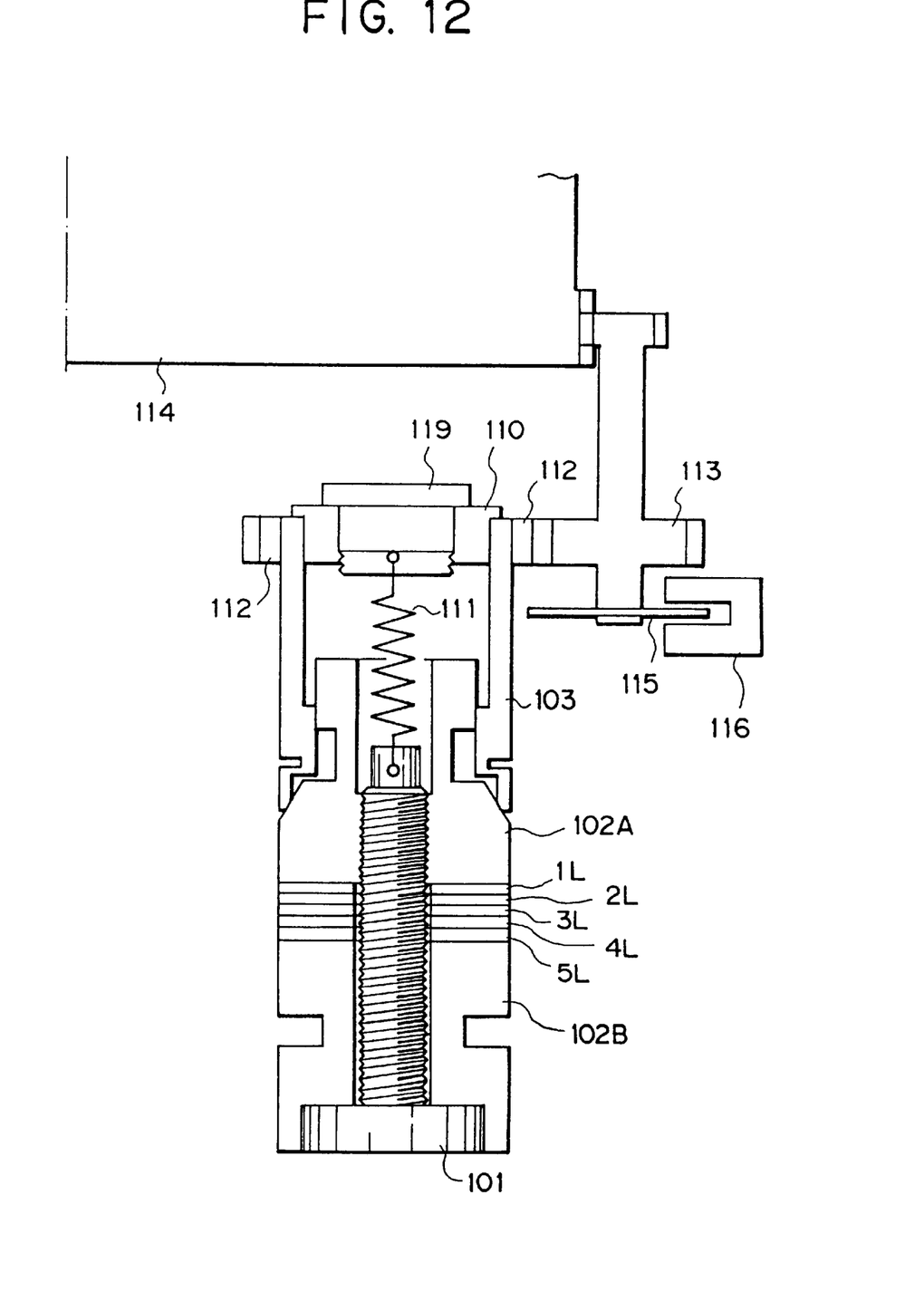
FIG. 12 shows a constructional diagram of a main section of a camera system using the vibration driven motor shown in FIG. 11 as a driving source.

FIG. 12 shows a constructional example in the case of driving a mirror barrel having a photographing lens using the motor shown in FIG. 11.

Reference numeral 112 denotes the gear which is coaxially joined with the moving member 103 and transfers a rotational output to a gear 113, thereby rotating a mirror barrel 114 having a gear adapted for engagement with the gear 113.

In order to detect rotating positions and rotational speeds of the moving member 103 and mirror barrel 114, an optical encoder slit plate 115 is arranged coaxially with the gear 113. The positions and speeds are detected by a photocoupler 116.

Reference numeral 119 denotes a spring post similar to that in FIG. 11; 110 denotes a bearing; and 111 denotes a spring for allowing the vibrators to be pressure contacted to each other.

According to the manufacturing method of the conversion device for the laminated type vibration driven motor according to the invention as mentioned above, there is no need to insert another metal electrode plate into a position between the piezoelectric elements. The overall thickness can be made thin. Expansion/contraction of each piezoelectric element is efficiently used to generate the neck shaking motion. The number of laminated layers of the piezoelectric element itself can be reduced or the thickness can be made thin. The electro-mechanical energy conversion device can be miniaturized. The motor also can be miniaturized as a result. Further, as compared with the conventional method whereby each of the polarized piezoelectric element is first formed and those piezoelectric elements are laminated in a state in which the metal plates for electrodes are interposed between them, according to the manufacturing method of the present invention, such works are simple and it is possible to provide an electro-mechanical energy conversion device for a laminate type vibration driven motor which can be easily formed even when each layer is thin and which is driven at a low voltage.

If an electrode wire between the layers is formed by a through hole filled with a conductive paste at the stage of forming the green sheet, then manufacturing steps to provide and connect a lead wire to the electrodes between the layers which were printed becomes unnecessary. The element can be further miniaturized and driving at a low voltage can be performed.

A bending vibration to the first and second directions is generated with four piezoelectric sheets in the above first embodiment. However, it is also possible to construct an electro-mechanical energy conversion device using three sheets, as follows: the first, second and fourth piezoelectric sheets 1L, 2L and 4L of the first embodiment are used, the first piezoelectric sheet 1L is sandwiched between second piezoelectric sheet 2L and fourth piezoelectric sheet 4L and these green sheets are stacked. The ground electrode G of first piezoelectric sheet 1L and the electrodes 2-A, 2-B of the fourth piezoelectric sheet 4L are electrically conducted to respective surface portions of second piezoelectric sheet 2L by way of respective through holes in the first and second piezoelectric sheets 1L, 2L.

What is claimed is:

1. A sintered laminated electro-mechanical energy conversion device for a vibration driven actuator, comprising:

a first electro-mechanical energy conversion member including first divided electrodes for generating vibration, said first divided electrodes being arranged to form a gap between said first divided electrodes and a circumferential periphery of said first electro-mechanical energy conversion member;

a second electro-mechanical energy conversion member including second divided electrodes for generating vibration, said second divided electrodes being divided with the same spacial phase as said first divided electrodes and arranged to form a gap between said second divided electrodes and a circumferential periphery of said second electro-mechanical energy conversion member;

a third member including plural signal input portions, said third member having a portion corresponding to a region in which said first divided electrodes and said second divided electrodes overlap, said plural signal input portions being arranged in said region; and conductive leads electrically connecting each of said first divided electrodes and each of said second divided electrodes to said plural signal input portions, said conductive leads being disposed in the region where said first divided electrodes and said second divided electrodes overlap.

2. A device according to claim 1, wherein said at least one conductive lead is disposed in a through hole formed in said first electro-mechanical energy conversion member or said second electro-mechanical energy conversion member.

3. A device according to claim 1, wherein a plurality of conductive leads are provided for electrically connecting said first divided electrodes, said second divided electrodes and said signal input portions.

4. A device according to claim 1, wherein said third member is laminated at an edge portion of the device.

5. A device according to claim 2, wherein said third member is laminated at an edge portion of the device.

6. A vibration driven actuator, comprising:

a vibration member; and a sintered laminated electro-mechanical energy conversion device for vibrating said vibration member, said energy conversion member comprising:

a first electro-mechanical energy conversion member including first divided electrodes for generating vibration in said vibration member, said first divided electrodes being arranged to form a gap between said first divided electrodes and a circumferential periphery of said first electro-mechanical energy conversion member;

a second electro-mechanical energy conversion member including second divided electrodes for generating vibration in said vibration member, said second divided electrodes being divided with the same spacial phase as said first divided electrodes and arranged to form a gap between said second divided electrodes and a circumferential periphery of said second electro-mechanical energy conversion member;

a third member including plural signal input portions, said third member having a portion corresponding to a region in which said first divided electrodes and said second divided electrodes overlap, said plural signal input portions being arranged in said region; and conductive leads electrically connecting each of said first divided electrodes and each of said second divided electrodes to said plural signal input portions, said conductive leads being disposed in the region in which said first divided electrodes and said second divided electrodes overlap.

7. An actuator according to claim 6, wherein said at least one conductive lead is disposed in a through hole formed in said first electro-mechanical energy conversion member or said second electro-mechanical energy conversion member.

8. An actuator according to claim 6, wherein a plurality of conductive leads are provided for connecting said first divided electrodes, said second divided electrodes and said signal input portions.

9. An actuator according to claim 6, wherein said third member is laminated at an edge portion of the device.

* * * * *

UNITED STATES PATENT AND TRADEMARK OFFICE
CERTIFICATE OF CORRECTION

PATENT NO. : 5,936,327

DATED : August 10, 1999

INVENTOR(S): SHIGERU TAKAHASHI, ET AL.

It is certified that error appears in the above-identified patent and that said Letters Patent is hereby corrected as shown below:

COLUMN 1,
Line 14, "device more" should read --device.  More--.

COLUMN 4,
Line 33, "the" should read --a--.

COLUMN 5,
Line 30, "becomes" should read --become--.

Signed and Sealed this

Twenty-eighth Day of March, 2000

Attest:

Q. TODD DICKINSON

Attesting Officer

Commissioner of Patents and Trademarks